(12) United States Patent
Hyvonen

(10) Patent No.: US 7,696,791 B2
(45) Date of Patent: Apr. 13, 2010

(54) HIGH-SPEED AMPLITUDE DETECTOR WITH A DIGITAL OUTPUT

(75) Inventor: Sami Hyvonen, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 123 days.

(21) Appl. No.: 11/968,143

(22) Filed: Dec. 31, 2007

(65) Prior Publication Data

US 2009/0167361 A1    Jul. 2, 2009

(51) Int. Cl.
H03K 5/22 (2006.01)
(52) U.S. Cl. .......................... 327/71; 327/65
(58) Field of Classification Search .............. 327/63, 327/65, 37, 68–71
See application file for complete search history.

(56) References Cited

U.S. PATENT DOCUMENTS

| | | | |
|---|---|---|---|
| 5,239,210 A * | 8/1993 | Scott | 327/63 |
| 5,933,054 A * | 8/1999 | Kimura | 330/254 |
| 6,404,285 B1 * | 6/2002 | Shkap | 330/261 |
| 6,583,661 B1 * | 6/2003 | Tanji et al. | 327/355 |
| 6,693,465 B1 * | 2/2004 | Rosno et al. | 327/71 |
| 7,023,276 B2 * | 4/2006 | Vollrath et al. | 330/261 |
| 7,088,981 B2 * | 8/2006 | Chang | 455/326 |
| 7,095,281 B2 * | 8/2006 | Zipper et al. | 330/261 |
| 7,102,411 B2 * | 9/2006 | Behzad | 327/359 |
| 7,471,148 B2 * | 12/2008 | Scuteri et al. | 330/253 |
| 7,538,618 B2 * | 5/2009 | Park et al. | 330/301 |
| 2004/0160245 A1 * | 8/2004 | Brooks et al. | 327/65 |
| 2006/0132253 A1 * | 6/2006 | Gelhausen et al. | 331/167 |

* cited by examiner

*Primary Examiner*—Lincoln Donovan
*Assistant Examiner*—Thomas J Hiltunen
(74) *Attorney, Agent, or Firm*—Blakely, Sokoloff, Taylor & Zafman LLP

(57) ABSTRACT

An amplitude detection circuit using a sinusoidal input signal inputs to produce a digital output (a one or zero) is described. The circuit uses an input field effect transistor (FET) with a gate load coupled to a gate of the input FET. A drain load may be coupled to a drain of the input FET. A source load may be coupled to a source of the input FET. A controllable variable current generator provides a current to the source of the input FET, biasing the source of the input FET to a reference voltage. An input signal conductor may be coupled to the gate of the input FET. Other embodiments are described.

12 Claims, 4 Drawing Sheets

US 7,696,791 B2

HIGH-SPEED AMPLITUDE DETECTOR WITH A DIGITAL OUTPUT

FIELD

This application generally relates to electrical circuits. More particularly, this application relates to a amplitude detection circuit where a differential sinusoidal input signal produces a digital output of a digital one or zero based for amplitudes exceeding a reference voltage.

BACKGROUND

Amplitude detection circuits are used to compare an input electrical signal against a reference signal, typically a voltage. The circuit generates an output, usually a high voltage (digital one), for an input signal amplitude greater than the reference signal and generates a different output, usually a low voltage (digital zero), for an input signal amplitude less than the reference signal.

BRIEF DESCRIPTION OF THE DRAWINGS

The following description can be better understood in light of the figures, in which.

Figure 1:
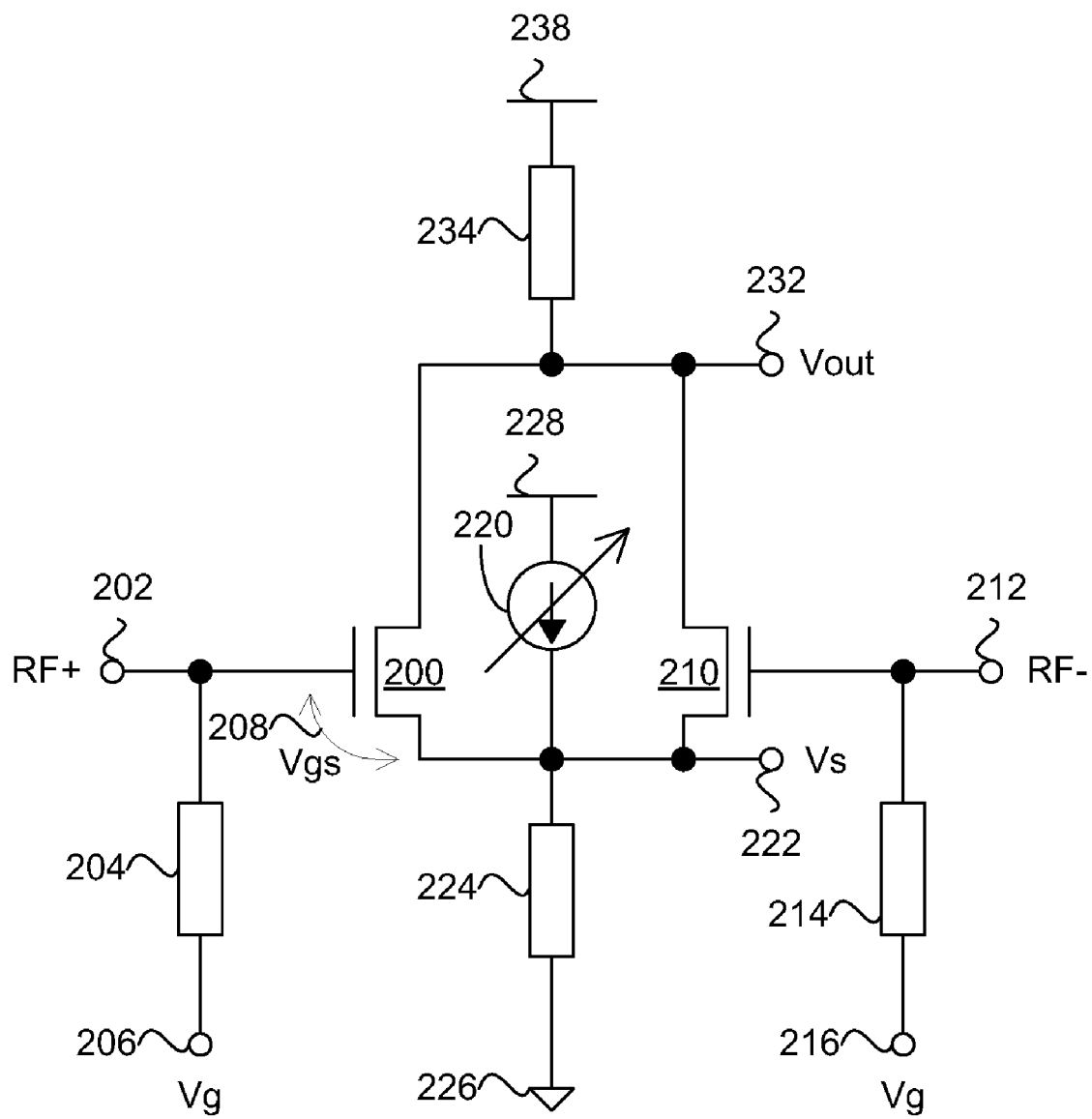
FIG. 1 illustrates a circuit schematic of some embodiments of an amplitude detection circuit.

The Figures illustrate specific aspects of the circuits. Together with the following description, the Figures demonstrate and explain the principles and operation of the circuits. In the drawings, the schematic circuit elements can represent their equivalent structures and connections. The same reference numerals in different drawings represent the same element, and thus their descriptions will not be repeated.

DETAILED DESCRIPTION

The following description supplies specific details in order to provide a thorough understanding. Nevertheless, the skilled artisan would understand the circuit operation and methods for making and using such circuits can be implemented and used without employing these specific details. The term field effect transistor (FET), FET transistor, FET, or transistor may be used interchangeably to refer to a FET.

A circuit schematic of an n-channel metal-oxide semiconductor (NMOS) that can be used in some embodiments of an amplitude detection circuit is shown in FIG. 1. A source of a first input field effect transistor (FET) 200 and a source of a second input FET 210 may be coupled together to form a source node 222. A drain of the FET 200 and a drain of the second input FET may be coupled together to form a drain node 232. The coupling of the sources of a first input and a second input FET together and coupling the drains of the first input and the second input FET together form a differential amplifier. The first input and the second input FETs form input transistors. The input voltage signal can be applied to an input conductor or input terminal. A NMOS FET can be modeled or understood as a switch that allows a current to flow through a channel between the source and drain of a FET when a voltage is applied to a gate (referenced to the source—Vgs) of the FET that exceeds threshold voltage (Vth).

Figure 2:
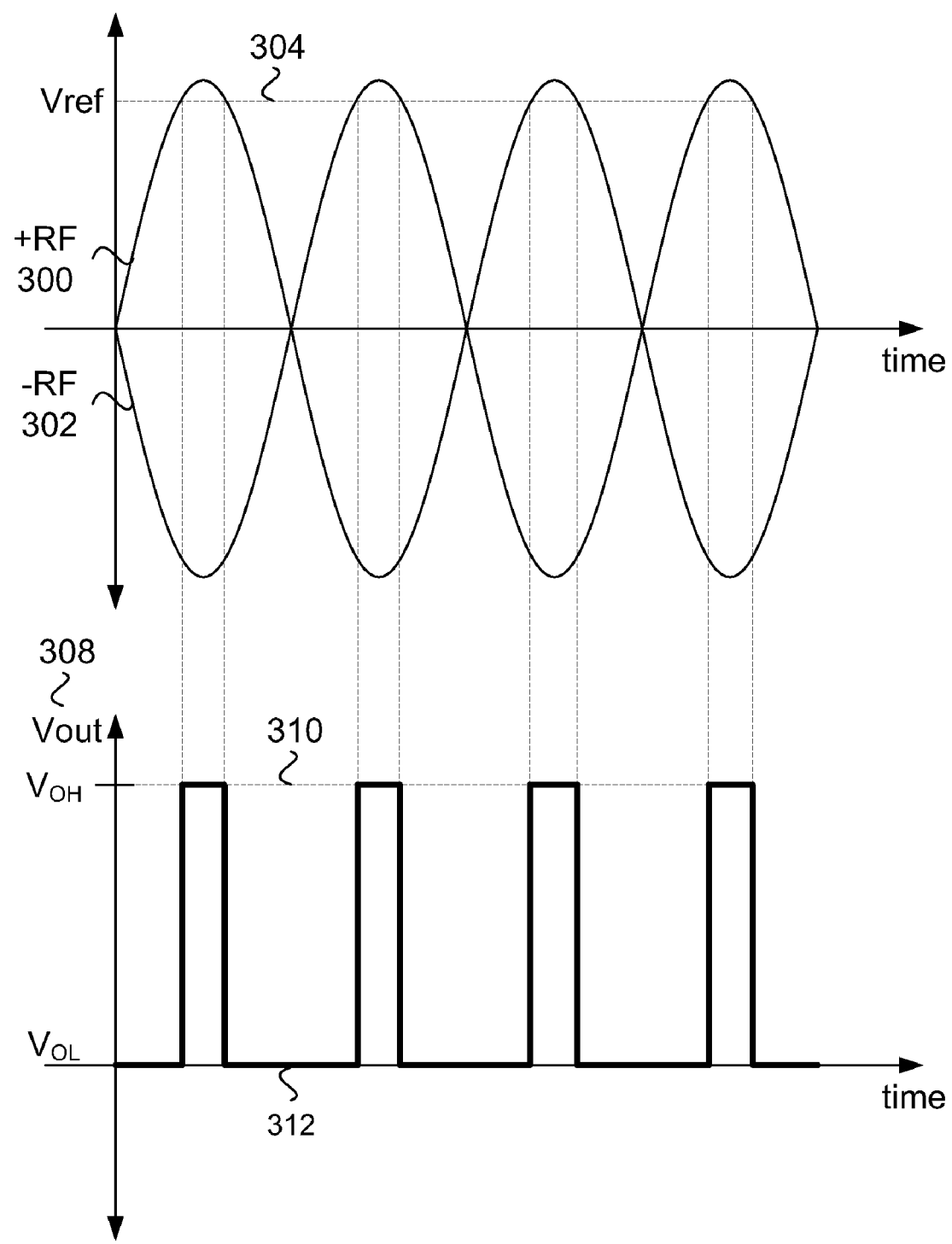
FIG. 2 illustrates a differential sinusoidal input signal and an output voltage resulting from an amplitude detection circuit using a differential pair amplifier in some embodiments.

The input voltage signal on the gate 212 of the second input FET may be the inverse of the input voltage signal on the gate 202 of the first input FET. One example of the input voltage signal and inverse input voltage signal is shown in FIG. 2. When the input voltage signal on the gate of the first input FET is 1.2 V 300, the input voltage signal on the gate of the second input transistor may be −1.2 V 302.

Other embodiments can also be illustrated by FIG. 1. The inverse input voltage signal may not be applied to the gate of the second input FET 202, so only the first input FET 200 operates as an amplifier. In another implementation, the amplifier of the amplitude detection circuit may use a first input FET without a second input FET, so an inverse input voltage signal for the circuit cannot be used. Removing the second input FET as an input transistor may form a single-ended amplifier implementation using a single input transistor.

A first input gate bias voltage (first input Vg) 206 for the first input FET 200 may be provided through a high-impedance first input gate load (first input Zg) 204 and a second input gate bias voltage (second input Vg) 216 for the second input FET 210 may be provided through a high-impedance second input gate load (second input Zg) 214. The first input gate bias voltage (first input Vg) and second input gate bias voltage (second input Vg) may be coupled together to form a gate bias voltage. The gate bias voltage may be labeled a gate bias voltage conductor, a gate voltage terminal, a gate bias voltage conductor, gate voltage terminal, gate bias voltage source, or gate voltage source where the gate bias voltage couples to a first input or second input gate load in the circuit. The first node of first input gate load may be coupled to the gate bias voltage and the second node of first input gate load may be coupled to the gate of the first input FET. The first node of the second input Zg may be coupled to the Vg and the second node of the second input Zg may be coupled to the gate of the first input FET. A load may be a combination of resistance, capacitors, inductors, FETs, transistors, or other circuit elements that can provide impedance to a current. A gate load is a load that is provides voltage biasing to the gate of a FET.

A controllable current source (CCS) or controllable variable current generator 220 may be coupled to the source (Vs) 222 of the first input FET 200 and a first node of the source load (Sload) 224. A CCS may provide a DC current through the source load, to generate a reference DC voltage (Vref) to the source (Vs) of the first input FET. The second node of the Sload may be coupled to a low voltage potential 226 for the circuit. The low voltage potential for the circuit may be ground or 0V. The CCS can be varied to bias Vs to Vref. Vref is the voltage on an input voltage signal that can switch an output voltage (Vout) from a low voltage ($V_{OL}$—digital 0) to a high voltage ($V_{OH}$—digital 1). In other embodiments, the first node on the Sload may be coupled to the source (Vs) 222 of the first input FET 200, the second node of the Sload being coupled to a first node of the CCS 220, and second node of the CCS being couple to low voltage potential 226 for the circuit. In another embodiment, the controllable variable current generator 220 may be a controllable variable voltage generator or a static voltage source.

A drain load (Dload) 234 may be coupled to the drain 232 of the first input FET 200 to control the output voltage signal. The first node of a drain load (Dload) may be coupled to the drain node 232. The output voltage (Vout) 232 for the circuit may be the coupled to the drain of the first input FET. The second node of the Dload may be coupled to a high voltage potential 238 for the circuit. The high voltage potential for a NMOS circuit implementation can be labeled VDD. When the first input FET or the second input FET 210 is switched on, a drain current will flow through the Dload and generate a voltage drop across the Dload; Vout will decrease to $V_{OL}$. When the first input and the second input FETs are switched off, virtually no drain current will flow through the Dload so virtually no voltage drop will occur across the Dload; Vout will increase to $V_{OH}$. If the second input FET is not present, then first input FET alone may be switched off for Vout to increase to $V_{OH}$. The output can be an inverted digital signal where the output voltage may be high voltage (digital 1) for a input voltage signal amplitude less than the Vref and the output voltage may be low voltage (digital 0) for a input voltage signal amplitude greater than the Vref.

The drain load (Dload) 234 may be an impedance device or combination of impedance devices. Impedance devices may include a resistor, a capacitor, or a transistor, so Dload may be a resistor, a capacitor, a transistor, a resistor and a capacitor connected in parallel, or a resistor and a capacitor connected in series. Likewise, the source load (Sload) 224, the first input gate load (first input Zg) 204, and the second input gate load (second input Zg) 214 may be an impedance device or combination of impedance devices.

In another embodiment, the drain load (Dload) 234 may be a capacitor so Vout 232 may have a low voltage when the first input FET 200 and the source of a second input FET 210 switch off. In another implementation, an average output current can be mirrored to another part of the circuit, with a possible amplification factor, so Dload can be a current mirror, resulting in a current output signal (as opposed to a voltage).

The relationship between the input signal voltages, Vref, and Vout for a non-inverted output (PMOS implementation) can be illustrated in FIG. 2. The time Vout 308 switches from $V_{OH}$ 310 to $V_{OL}$ 312 and from $V_{OL}$ to $V_{OH}$ and square wave form of Vout is illustrative and may be exaggerated for clarity. For example, Vref 304 can be 3.3 V, the low voltage potential for the circuit can be 0 V, and the high voltage potential for the circuit can be 4 V. When the input voltage signals 300 and 302 are greater than or equal to 3.3 V, Vout may be $V_{OH}$ or near 4 V. When the input voltage signals falls below 3.3 V, Vout may be $V_{OL}$ or near 0V.

The gate bias voltage 206 and 216 can be selected so the first input FET 200 and the second input FET 212 may be in cut-off when no input voltage signal 202 and 212, respectively, exists, but turn on when one of input voltage signals exceeds a threshold voltage. The input voltage signal can be a radio frequency (RF) signal. The gate bias voltage can be selected so the first input and the second input FETs may turn on when the input voltage reaches a peak swing (vrf,peak) of the RF signal. The first input and the second input FETs may turn on when the input voltage signal has a large enough amplitude.

With the source voltage (Vs) 222 bias to Vref (Vs=Vref), the gate bias voltage (Vg) 206 may be selected to be equal to the threshold voltage (Vth) to turn on the first input FET transistor 200 and the second input FET transistor 212 (Vg=Vth). Vth is the voltage (Vgs) 208 needed between the gate and source voltages of the FET to turn on FET. At the peak of the signal swing, the gate-source voltage can be characterized by:

Vgs=vrf,peak+Vg−Vs=vrf,peak+Vth−Vref.

If the condition of vrf,peak>Vref, then Vgs>Vth at the input voltage signal swing peak is met, the FET turns on.

When the amplitude of the input voltage signals 202 and 212 falls below Vref, the first input FET 200 and the second input FET 210 may stay off throughout the signal period. When the first input FET or the second input FET is switched on, Vout will decrease to $V_{OL}$ or a digital 0. When the first input and the second input FETs are switched off (or the second input FET is not present and first input FET is switched off), Vout will increase to $V_{OH}$ or a digital 1.

The FET shown in the Figures can be any FET known in the art. In some embodiments, the FET can be an n-channel FET (nFET, n-type FET, n-p-n FET, or NMOS) or p-channel (pFET, n-type FET, p-n-p FET, or p-channel metal-oxide semiconductor (PMOS)). In those embodiments where NMOS transistors are used, the first input FET 200 and the second input FET 212 may be nFETs. The second node of the Dload 234 and a first node 228 for the CCS 220 may be coupled to a high voltage potential 238. The second node of the Sload 224 may be coupled to a low voltage potential 226. Vgs needs to be greater than the threshold voltage (Vth) to turn on the first input FET or the second input FET (Vgs>Vth). When either the first input or the second input FET 210 is switched on, a drain current will flow through the Dload and generate a voltage drop across the Dload; Vout will decrease to $V_{OL}$ to produce a digital 0. When the first input and the second input FETs are switched off (or the second input FET is not present and first input FET is switched off), virtually no drain current will flow through the Dload so virtually no voltage drop will occur across the Dload; Vout will increase to $V_{OH}$ to produce a digital 1. So, Vout produces a digital 1 when vrf,peak<Vref and a digital 0 when vrf,peak>Vref.

In those embodiments where a PMOS transistor is used, the first input FET 200 and the second input FET 212 may be pFETs. The second node of the Dload 234 and a first node for the CCS 220 may be coupled to a low voltage potential. The second node of the Sload 224 may be coupled to a high voltage potential 226. Vgs needs to be less than the threshold voltage (Vth) to turn on the first input FET or the second input FET (Vgs<Vth). When either the first input or the second FET 210 is switched on, a drain current will flow through the Dload and generate a voltage drop across the Dload; Vout will increase to $V_{OH}$ to produce a digital 1. When the first input and the second input FETs are switched off (or the second input FET is not present and first input FET is switched off), virtually no drain current will flow through the Dload so virtually no voltage drop will occur across the Dload; Vout will decrease to $V_{OL}$ to produce a digital 0. So, Vout produces a digital 0 when vrf,peak<Vref and a digital 1 when vrf,peak>Vref. The output voltage of the PMOS implementations is the inverse of the NMOS implementations.

Figure 3A:
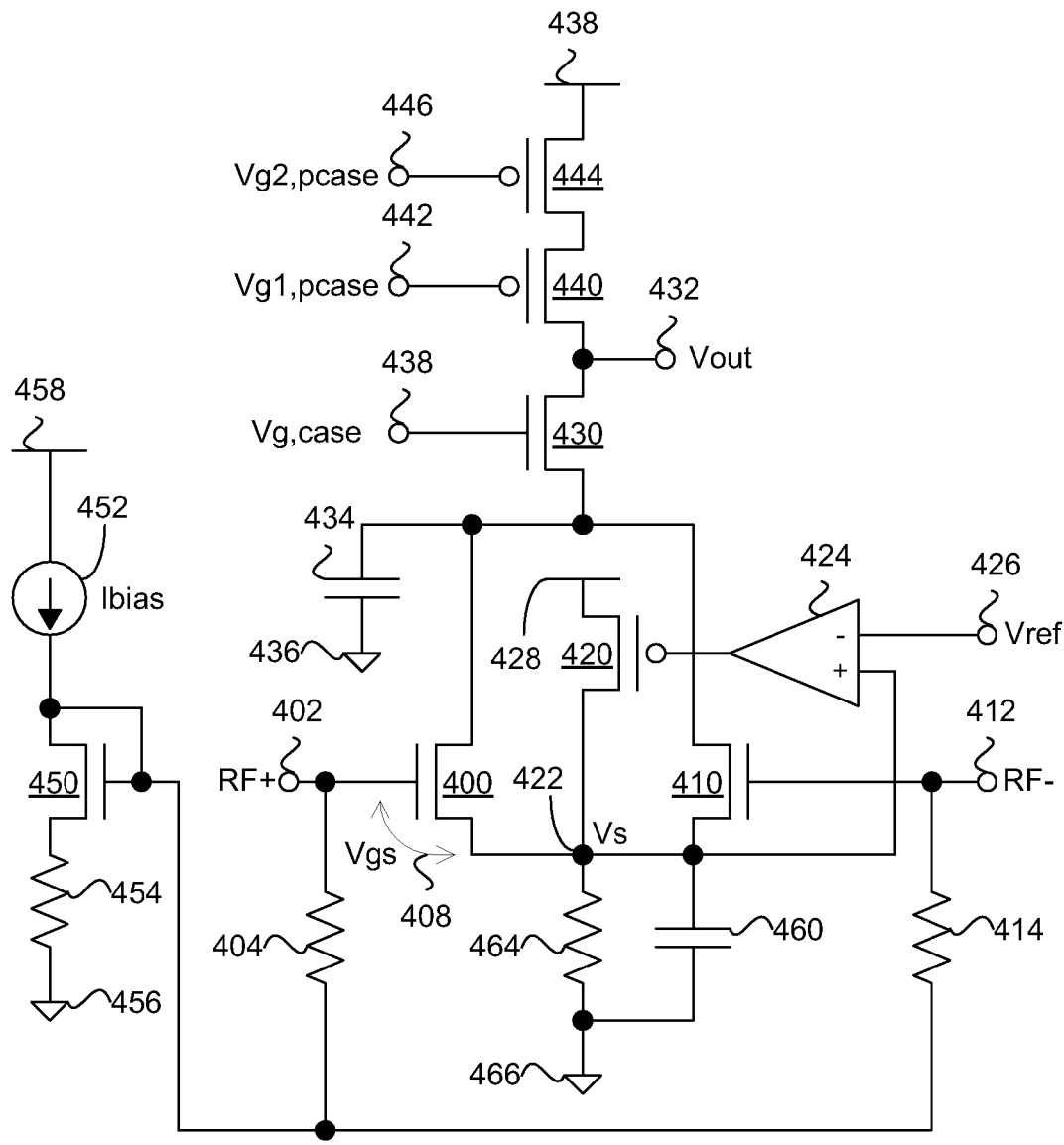
FIG. 3A illustrates a circuit schematic of some embodiments of an amplitude detection circuit using n-channel field effect transistors (FETs) for the differential pair.
Figure 3B:
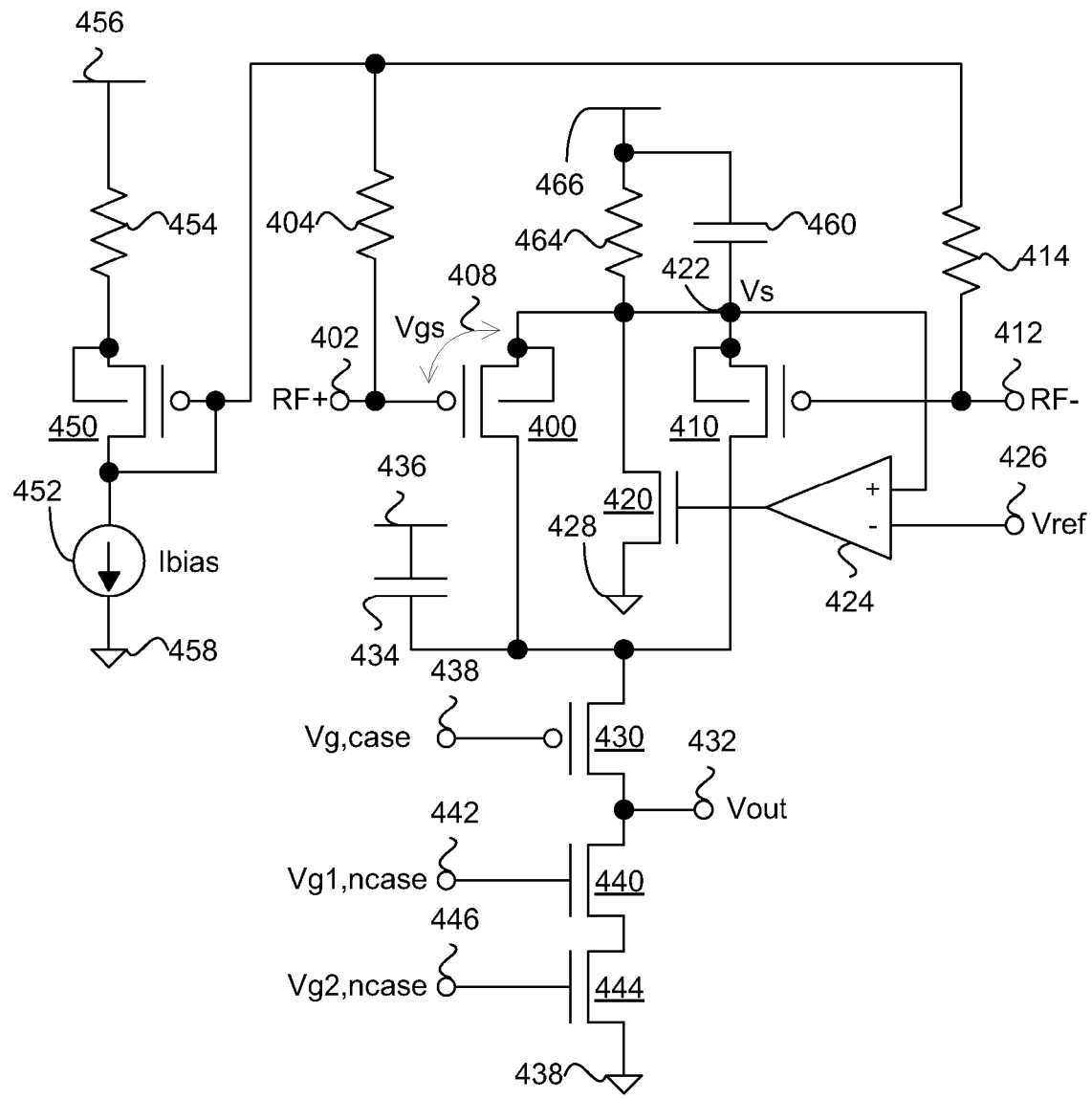
FIG. 3B illustrates a circuit schematic of some embodiments of an amplitude detection circuit using p-channel field effect transistors (FETs) for the differential pair.

Those embodiments where NMOS transistors are used is shown in FIG. 3A and those embodiments where PMOS transistors are used is shown in FIG. 3B. The same numbering in FIG. 3A and FIG. 3B indicates the circuit elements may be similar, may perform a similar function, and may be coupled in a similar manner. Distinctions between the circuit in FIG. 3A and FIG. 3B may be noted. For example, nFETs in the NMOS embodiments (FIG. 3A) are pFETs in the PMOS embodiments (FIG. 3B), and vice versa. The low voltage nodes in the NMOS embodiments are the high voltage nodes in the PMOS embodiments, and vice versa. Resisters, capacitors, and current sources may be the same. The source of an nFET can be at a lower voltage than the drain of the same nFET while the source of a pFET can be at the higher voltage than the drain of the same pFET.

For NMOS embodiments, the first input FET 400 and the second input FET may be nFETs. For PMOS embodiments, the first input FET 400 and the second input FET may be pFETs with the bases of the first input and the second input FETs being coupled to the drains of the first input and the second input FETs, respectively. The base of a FET is the substrate or well that forms the channel between the source and the drain of the FET. The capacitance of a pFET's NWell may improve the circuit's operation. The PMOS implementations (unlike the NMOS implementations) of the amplitude detection circuit may not suffer from body-bias effects that can affect the amplitude detection linearity of the circuit.

In both the NMOS embodiments shown in FIG. 3A and the PMOS embodiments shown in FIG. 3B, the source load (Sload) 224 of FIG. 1 may be a parallel RC network with a first node of a source resistor 464 and a first node of a source capacitor 460 coupled to the source 422 of the first input FET 400. The second node 466 of a source resistor and a second node of a source capacitor may be coupled to a low voltage potential (ground) for the NMOS embodiments or coupled to a high voltage potential (VSS) for the PMOS embodiments.

The controllable current source (CCS) or controllable variable current generator 220 of FIG. 1 may include a source bias FET 420 coupled to an op amp (operational amplifier) 424. The output terminal may be coupled to the gate of the source bias FET. The negative input terminal may be coupled to the reference voltage (Vref) 426. The reference voltage may be labeled a reference voltage conductor or a reference voltage terminal where the reference voltage couples to the circuit. The positive input terminal may be coupled to the source node 422 for feedback. For the NMOS embodiments, the drain 428 of the source bias FET (pFET) may be coupled to a high voltage potential (VDD). For the PMOS embodiments, the drain of the source bias FET (nFET) may be coupled to a low voltage potential (ground).

The source bias FET 420 acts as a controllable current source where the op amp 424 controls the gate voltage of the source bias FET, hence the source bias FET's drain current. The op amp may include any circuit elements configured to function as an op amp. The op amp feedback loop can set the current through the source resistor (Rs) 464 such that source voltage (Vs) equals the reference voltage (Vref). The capacitor (Cs) 460 may act as a low impedance path for the RF input signal, so the transconductance of the first input FET 400 and the second input FET 410 is high at high frequencies.

The gate voltage 206 of FIG. 1 may include a diode-connected gate bias FET 450, a bias current generator 452, and a bias resistor 454. A drain of the gate bias FET may be coupled to a gate of the gate bias FET forming a diode connected FET which may also be coupled to a first node of the bias resistor. A source of the gate bias FET may be coupled to a first node of the bias current generator. The bias current generator may include any circuit elements configured to function as a current generator. For the NMOS embodiments, the gate bias FET may be a nFET, a second node of the bias current generator may be coupled to a low voltage potential (ground), and a second node of bias resistor may be coupled to a high voltage potential (VDD). For the PMOS embodiments, the gate bias FET may be a pFET, the second node of the bias current generator may be coupled to a high voltage potential (VSS) and the second node of bias resistor may be coupled to a low voltage potential (ground) with the base of the gate bias FET (pFET) being coupled to the drain of the gate bias FET.

The gate voltage bias 206 of FIG. 1 may be generated with the diode-connected gate bias FET 450 that may be slightly turned on, so Vgs 408 may be approximately equal to the threshold voltage (Vth). The bias resistor (Rb) 454 can be used to adjust the gate voltage of the first input FET 400 and the second input FET 410 which form the differential pair amplifier.

The first input gate load 204 and the second input gate load 214 of FIG. 1 may include a first input gate resistor 404 and a second input gate resistor 414, respectively. A first node of the first input gate resistor may be coupled to the gate 402 of the first input FET 400. A first node of the second input gate resistor may be coupled to the gate 412 of the second input FET 410. The gate of the gate bias FET may be couple to a second node of the first input gate resistor and a second node of the second input gate resistor. The first input gate resistor and the second input gate resistor can be loads between the gate voltage 206 of FIG. 1 and the input voltage signals 402 and 412. The first input and second input gate resistors allow the input voltage at the gates of the input FETs (first input FET and second input FET) to swing and turn on the input FETs.

The drain load 234 of FIG. 1 may include two cascode configured circuits with the output voltage between the two cascode circuits. The drain load may use a first load FET 430, a second load FET 440, a third load FET 444, and a drain capacitor 434. The first input FET and the first load FET coupled in series or the second input FET and the first load FET coupled in series can form a first cascode configured circuit. The second load FET and the third load FET coupled in series can form a second cascode configured circuit. A source of the first load FET may be coupled to the drain of the first input FET 400 transistor and a first node of the drain capacitor. A drain of the first load FET may be coupled to the drain of the second load FET and an output voltage terminal. A drain of the third load FET may be coupled to a source of the second load FET. For the NMOS embodiment, the first load FET may be an nFET, the second load FET and the third load FET may be pFETs, a second node of the drain capacitor may be coupled to a low voltage potential (ground), a source of the third load FET may be coupled to a high voltage potential (VDD), a gate of the first load FET may be coupled to the case of the circuit which may be a low voltage potential (ground), and gates of the second load FET and the third load FET may be coupled to the pcase for the pFETs of the circuit which may be a high voltage potential (VDD). For the PMOS embodiment, the first load FET may be a pFET, the second load FET and the third load FET may be nFETs, a second node of the drain capacitor may be coupled to a high voltage potential (VSS), a source of the third load FET may be coupled to a low voltage potential (ground), a gate of the first load FET may be coupled to the case of the circuit which may be a high voltage potential (VSS), and gates of the second load FET and the third load FET may be coupled to the ncase for the nFETs of the circuit which may be a low voltage potential (ground).

For the NMOS embodiments, the current through the cascode pFETs (second load FET 440 and third load FET 444) can be very small (a few microamps). For the PMOS embodiments, the current through the cascode nFETs (second load FET 440 and third load FET 444) can also be very small (a few microamps). For both the NMOS and PMOS embodiments, the drain capacitor (Cd) can be added to filter the RF input voltage signal.

The circuit operates as follows. When the RF input voltage signal 402 or 412 becomes high enough to turn on the input transistors (first input FET 400 and second input FET 410) at the signal peaks, an average current flows through the second load FET 440. When the average current through the second load FET becomes higher than the current of current source (source bias FET 420), the output voltage (Vout 432) will decrease to limit the average current. The decreased voltage in Vout indicates that the RF input signal amplitude is above the reference voltage (Vref). However, when the RF signal is too weak to turn on the first input FET 400 and the second input FET 410 (the amplitude of the RF signal smaller than Vref) at any point of the signal period, the average current through the second load FET is zero (with some leakage), and the output voltage (Vout) will increase to limit the current of the source bias FET. The increased voltage in Vout indicates that the RF input signal amplitude is below the reference voltage (Vref). Thus, the output voltage may be essentially a digital bit (high or low), indicating the input signal amplitude is below or above the reference voltage (Vref).

In another embodiment, a controllable current generator 220 or voltage generator, as shown in FIG. 1, may allow using the amplitude detector (with a fixed reference voltage) as an amplitude measurement unit, where a negative feedback loop can adjust the source voltage (reference voltage) 222 until the output 232 reaches a reference voltage level. The negative feedback loop may include a coupling of the output voltage to the reference voltage. A circuit component may couple the output voltage to the reference voltage and be between the output voltage and the reference voltage. A circuit component may be a resistor, capacitor, transistor, comparator, or op amp. For this embodiment, the reference voltage may be used to measure the amplitude of the input signal.

The circuits described above provide lower power consumption and can handle input signals of higher frequencies than conventional circuits which are sensitive to process variations. A digital output (analog-to-digital conversion) is inherent in this topology. The output signal can be digital and the noise introduced by the analog circuitry will not be present in the output signal. The circuit can handle input signals of most frequencies because the operation is based on average currents. For low frequencies, the operation may be limited by the capacitors Cs and Cd. For high frequencies, the operation may be limited by the non-quasi-static (NQS) thermal noise effects inherent in FETs and the capacitive loading the detector exhibits to a previous stage.

Having described the preferred embodiments of the circuits and associated methods of using them, it is understood that the appended claims are not to be limited by particular details set forth in the above description, as many apparent variations thereof are possible without departing from the spirit or scope thereof.

The invention claimed is:

1. An electrical circuit, comprising:
a first input FET that partially controls output voltage signals responsive to an input voltage;
a gate load coupled to a gate of the first input FET;
a drain load coupled to a drain of the first input FET;
a source load coupled to a source of the first input FET;
a controllable variable current generator providing a current to the source of the first input FET, biasing the source of the first input FET to a reference voltage, wherein the controllable variable current generator comprises a source bias FET and an op amp, a source of the source bias FET and a positive input terminal of the op amp coupled to the source of the first input FET, a gate of the source bias FET coupled to the output terminal of the op amp, and a negative input terminal of the op amp coupled to a reference voltage conductor;
a first input conductor coupled to the gate of the first input FET and an input voltage signal including a variable input signal applied to the first input conductor; and
a gate bias voltage source coupled to the gate load wherein the gate bias voltage source comprises a gate bias FET, a bias current generator, and a bias resistor, and the gate load comprises a first input gate resistor, the bias current generator providing a current to a drain of the gate bias FET with the drain of the gate bias FET coupled to a gate of the gate bias FET and a first terminal of the first input gate resistor, a source of the gate bias FET coupled to the bias resistor, and a second terminal of the first input gate resistor coupled to a gate of the first input FET.

2. The circuit of claim 1, wherein the drain load comprises a second load FET and a third load FET connected in series, a source of the second load FET coupled to the drain of the first input FET, a drain of the second load FET coupled to a source of the third load FET, and an output conductor coupled to the drain of the first input FET.

3. The circuit of claim 1, wherein the drain load comprises a first load FET, a second load FET, and a third load FET connected in series, a source of the first load FET coupled to the drain of the first input FET, a source of the second load FET coupled to a drain of the first load FET, and a drain of the second load FET coupled to a source of the third load FET, and an output conductor coupled to the drain of the first load FET.

4. The circuit of claim 3, wherein the drain load further comprises a drain capacitor coupled to the drain of the first input FET.

5. The circuit of claim 4, further comprising a second input gate resistor and a second input FET, the first input and the second input FETs form a differential pair amplifier, the source of the first input FET coupled to a source of the second input FET, the drain of the first input FET coupled to a drain of the second input FET, a first terminal of the second input gate resistor coupled to the gate of the gate bias FET, a second terminal of the second input gate resistor coupled to a gate of the second input FET, a second input conductor coupled to the gate of the second input FET, and a second input voltage signal applied to the second input conductor, the second input voltage including an inverted input signal of the first input voltage signal.

6. The circuit of claim 5, wherein the source load comprises a source resistor and a source capacitor coupled in parallel to the source of the first input FET.

7. The circuit of claim 6, wherein each first input FET, second input FET, first load FET, and gate bias FET comprise a n-channel FET and each source bias FET, second load FET, and third load FET comprise a p-channel FET.

8. The circuit of claim 7, wherein each first input FET, second input FET, first load FET, and gate bias FET comprise a p-channel FET and each source bias FET, second load FET, and third load FET comprise an n-channel FET.

9. The circuit of claim 8, wherein a base of the first input FET coupled to the source of the first input FET, a base of the second input FET coupled to the source of the second input FET, and a base of the gate bias FET coupled to the source of the gate bias FET.

10. An electrical circuit, comprising:
a first input FET coupled to a second input FET forming a differential pair amplifier, the source of the first input FET coupled to a source of the second input FET, and the drain of the first input FET coupled to a drain of the second input FET.
a gate load coupled to a gate of the first input FET;
a drain load coupled to a drain of the first input FET, wherein the drain load comprises a drain capacitor coupled to the drain of the first input FET, wherein the drain load comprises a second load FET and a third load FET connected in series, a source of the second load FET coupled to the drain of the first input FET, a drain of the second load FET coupled to a source of the third load FET, and an output conductor coupled to the drain of the first input FET;

a source load coupled to a source of the first input FET;

a controllable variable current generator to provide a current to the source of the first input FET, biasing the source of the first input FET to a reference voltage;

a first input conductor coupled to the gate of the first input FET and a input voltage signal including a variable input signal applied to the first input conductor;

a second input conductor coupled to the gate of the second input FET, and a second input voltage signal applied to the second input conductor, the second input voltage including an inverted input signal of the first input voltage signal.

11. An electrical circuit, comprising:

a first input FET coupled to a second input FET forming a differential pair amplifier, the source of the first input FET coupled to a source of the second input FET, and the drain of the first input FET coupled to a drain of the second input FET.

a gate load coupled to a gate of the first input FET;

a drain load coupled to a drain of the first input FET, wherein the drain load comprises a drain capacitor coupled to the drain of the first input FET, wherein the drain load comprises a first load FET, a second load FET, and a third load FET connected in series, a source of the first load FET coupled to the drain of the first input FET, a source of the second load FET coupled to a drain of the first load FET, and a drain of the second load FET coupled to a source of the third load FET, and an output conductor coupled to the drain of the first load FET;

a source load coupled to a source of the first input FET;

a controllable variable current generator to provide a current to the source of the first input FET, biasing the source of the first input FET to a reference voltage;

a first input conductor coupled to the gate of the first input FET and a input voltage signal including a variable input signal applied to the first input conductor;

a second input conductor coupled to the gate of the second input FET, and a second input voltage signal applied to the second input conductor, the second input voltage including an inverted input signal of the first input voltage signal.

12. The circuit of claim 11, wherein the controllable variable current generator comprises a source bias FET and a op amp, a source of the source bias FET and a positive input terminal of the op amp coupled to the source of the first input FET, a gate of the source bias FET coupled to the output terminal of the op amp, and a negative input terminal of the op amp coupled to a reference voltage conductor.

* * * * *